United States Patent
Ravi (10) Patent No.: US 12,289,111 B1
(45) Date of Patent: Apr. 29, 2025

(54) SYSTEM AND METHOD USING A FAST SETTLING ACCUMULATOR

(71) Applicant: Cadence Design Systems, Inc., San Jose, CA (US)

(72) Inventor: Hari Anand Ravi, Bangalore (IN)

(73) Assignee: Cadence Design Systems, Inc., San Jose, CA (US)

( * ) Notice: Subject to any disclaimer, the term of this patent is extended or adjusted under 35 U.S.C. 154(b) by 87 days.

(21) Appl. No.: 17/972,814

(22) Filed: Oct. 25, 2022

(51) Int. Cl.
*H04L 7/00* (2006.01)
*H03L 7/08* (2006.01)
*H04L 7/033* (2006.01)

(52) U.S. Cl.
CPC .......... *H03L 7/0807* (2013.01); *H04L 7/0337* (2013.01)

(58) Field of Classification Search
CPC ........................... H03L 7/0807; H04L 7/0337
USPC ....................................................... 375/355
See application file for complete search history.

(56) References Cited

U.S. PATENT DOCUMENTS

| | | | | |
|---|---|---|---|---|
| 5,463,351 | A * | 10/1995 | Marko | H03L 7/07 375/376 |
| 7,519,138 | B2 * | 4/2009 | Lee | H01L 29/808 340/146.2 |
| 9,264,219 | B1 * | 2/2016 | Kang | H03L 7/093 |
| 9,485,082 | B1 * | 11/2016 | Sun | H03L 7/0807 |
| 10,355,889 | B1 * | 7/2019 | Huss | H04L 25/03057 |
| 10,365,854 | B1 * | 7/2019 | Muchherla | G06F 3/0649 |
| 2014/0126656 | A1 * | 5/2014 | Chung | H04L 7/0331 375/259 |
| 2018/0013593 | A1 * | 1/2018 | Chen | H03L 7/0807 |
| 2018/0323956 | A1 * | 11/2018 | Chen | H03L 7/0807 |

* cited by examiner

*Primary Examiner* — Helene E Tayong
(74) *Attorney, Agent, or Firm* — Mark H. Whittenberger; Holland & Knight LLP (57) ABSTRACT

The present disclosure relates to a system and method for clock phase recovery. Embodiments may include sampling data using an in-phase clock and a quadrate phase clock. Embodiments may further include analyzing sampled data from the in-phase clock and the quadrate phase clock. Embodiments may also include determining a convergence point based upon, at least in part, the analyzed sampled data, wherein the convergence point corresponds to a point where a number of early sampled outcomes is approximately equal to a number of late sampled outcomes. Embodiments may also include dynamically updating an accumulator threshold based upon the convergence point.

17 Claims, 12 Drawing Sheets

| K$_1$=8, K$_2$=128 | | Threshold function options | | | |
|---|---|---|---|---|---|
| ΔK=120 | | Option A | Option B | Option C | Option D |
| | | | Linear | | |
| density (%) | x (rad) | Constant (K$_2$) | (inc and dec) | ΔK*(sin$^2$ x)+K$_1$ | ΔK*(sin$^8$ x)+K$_1$ |
| 0 | 0.00 | 128 | 8 | 8 | 8 |
| 6 | 0.17 | 128 | 21 | 12 | 8 |
| 11 | 0.35 | 128 | 35 | 22 | 8 |
| 17 | 0.52 | 128 | 48 | 38 | 8 |
| 22 | 0.70 | 128 | 61 | 58 | 11 |
| 28 | 0.87 | 128 | 75 | 78 | 22 |
| 33 | 1.05 | 128 | 88 | 98 | 46 |
| 39 | 1.22 | 128 | 101 | 114 | 81 |
| 44 | 1.40 | 128 | 115 | 124 | 114 |
| 50 | 1.57 | 128 | 128 | 128 | 128 |
| 56 | 1.75 | 128 | 115 | 124 | 114 |
| 61 | 1.92 | 128 | 101 | 114 | 81 |
| 67 | 2.09 | 128 | 88 | 98 | 46 |
| 72 | 2.27 | 128 | 75 | 78 | 22 |
| 78 | 2.44 | 128 | 61 | 58 | 11 |
| 83 | 2.62 | 128 | 48 | 38 | 8 |
| 89 | 2.79 | 128 | 35 | 22 | 8 |
| 94 | 2.97 | 128 | 21 | 12 | 8 |
| 100 | 3.14 | 128 | 8 | 8 | 8 |

SYSTEM AND METHOD USING A FAST SETTLING ACCUMULATOR

DISCUSSION OF THE RELATED ART

A typical computing device is implemented with a microprocessor, memory, and a number of other modules depending on the function to be performed by the computing device. Double data rate (DDR) random access memory (RAM) is a particular type of RAM commonly used in current technology that performs two read accesses or two write accesses per clock cycle. Microprocessors and DDR RAM both operate on various different power supply voltages. Interface circuits that can convert between different signal levels and different drive levels are used to allow for compatible communications between microprocessors and memory devices.

Accumulators are used in training algorithms for high-speed IPs. Some training algorithms where an accumulator is used may include clock phase training, reference voltage training for single-ended signaling, equalization training (e.g., decision feedback equalization (DFE), continuous time linear equalization (CTLE), feed forward equalization (FFE), clock duty cycle correction training, and transmitter impedance training (ZQ CAL). Speeding up the settling time of accumulators used in training algorithms for high-speed systems may help to reduce the training algorithm convergence time. Typically, in a training algorithm used in a high-speed data transfer system, a decision is made based on an evaluation. For instance, a decision to increase or decrease the phase of a sampling clock is based on the sampled data value. To minimize the impact of supply noise, signal jitter, and other non-idealities on the decision being made, the same evaluation is repeated multiple times. The result of each evaluation is accumulated over time and the decision is made only when the accumulated result reaches a defined threshold. A high accumulator threshold ensures good noise filtering (good accuracy) but slows down the decision-making process (increases convergence time). A low accumulator threshold helps in providing for a faster convergence of the algorithm, but compromises accuracy.

SUMMARY

In one or more embodiments of the present disclosure, a clock phase recovery method is provided. The method may include sampling data using a first clock and sampling data using a second clock. The method may further include analyzing sampled data from the first clock and the second clock and determining a convergence point based upon, at least in part, the analyzed sampled data. The method may also include dynamically updating an accumulator threshold based upon the convergence point.

One or more of the following features may be included. The first clock may be an in-phase clock and the second clock may be a quadrate phase clock. Dynamically updating may be based upon, at least in part, an analysis of early density and late density. The first clock and the second clock may be 90° apart in phase. The method may further include determining whether to increment or decrement the clock phase based upon, at least in part, the dynamically updated accumulator threshold. The convergence point may correspond to a point where a number of early sampled outcomes equals a number of late sampled outcomes. Dynamically updating may be based upon, at least in part, the number of early sampled outcomes and the number of late sampled outcomes. The clock phase recovery method may be included within an accumulator training process. The accumulator training process may be included within a high speed data transfer system selected from the group consisting of: double data rate (DDR), universal serial bus (USB), and high definition multimedia interface (HDMI).

In one or more embodiments of the present disclosure, a fast settling accumulator system is provided. The system may include an in-phase clock configured to sample data and a quadrate phase clock configured to sample data. The system may include a processor configured to analyze sampled data from the in-phase clock and the quadrate phase clock, determine a convergence point based upon, at least in part, the analyzed sampled data and to dynamically update an accumulator threshold based upon the convergence point. One or more of the following features may be included. Dynamically updating may be based upon, at least in part, an analysis of early density and late density. The first clock and the second clock may be 90° apart in phase. The system may be configured to determine whether to increment or decrement the clock phase based upon, at least in part, the dynamically updated accumulator threshold. The convergence point may correspond to a point where a number of early sampled outcomes equals a number of late sampled outcomes. Dynamically updating may be based upon, at least in part, the number of early sampled outcomes and the number of late sampled outcomes. The fast settling accumulator method may be included within an accumulator training process. The accumulator training process may be included within a high speed data transfer system selected from the group consisting of: double data rate (DDR), universal serial bus (USB), and high definition multimedia interface (HDMI).

In one or more embodiments of the present disclosure, a fast settling accumulator method is provided. The method may include sampling data using an in-phase clock and a quadrate phase clock. The method may further include analyzing sampled data from the in-phase clock and the quadrate phase clock. The method may also include determining a convergence point based upon, at least in part, the analyzed sampled data, wherein the convergence point corresponds to a point where a number of early sampled outcomes is approximately equal to a number of late sampled outcomes. The method may also include dynamically updating an accumulator threshold based upon the convergence point, wherein the fast settling accumulator is included within a process selected from the group consisting of reference voltage training for single-ended signaling, equalization training, continuous time linear equalization (CTLE), feed forward equalization (FFE), clock duty cycle correction training, and transmitter impedance training.

One or more of the following features may be included. Dynamically updating may be based upon, at least in part, the number of early sampled outcomes and the number of late sampled outcomes.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the invention and are incorporated in and constitute a part of this specification, illustrate embodiments of the invention and together with the description serve to explain the principles of embodiments of the invention.

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Figure 1:
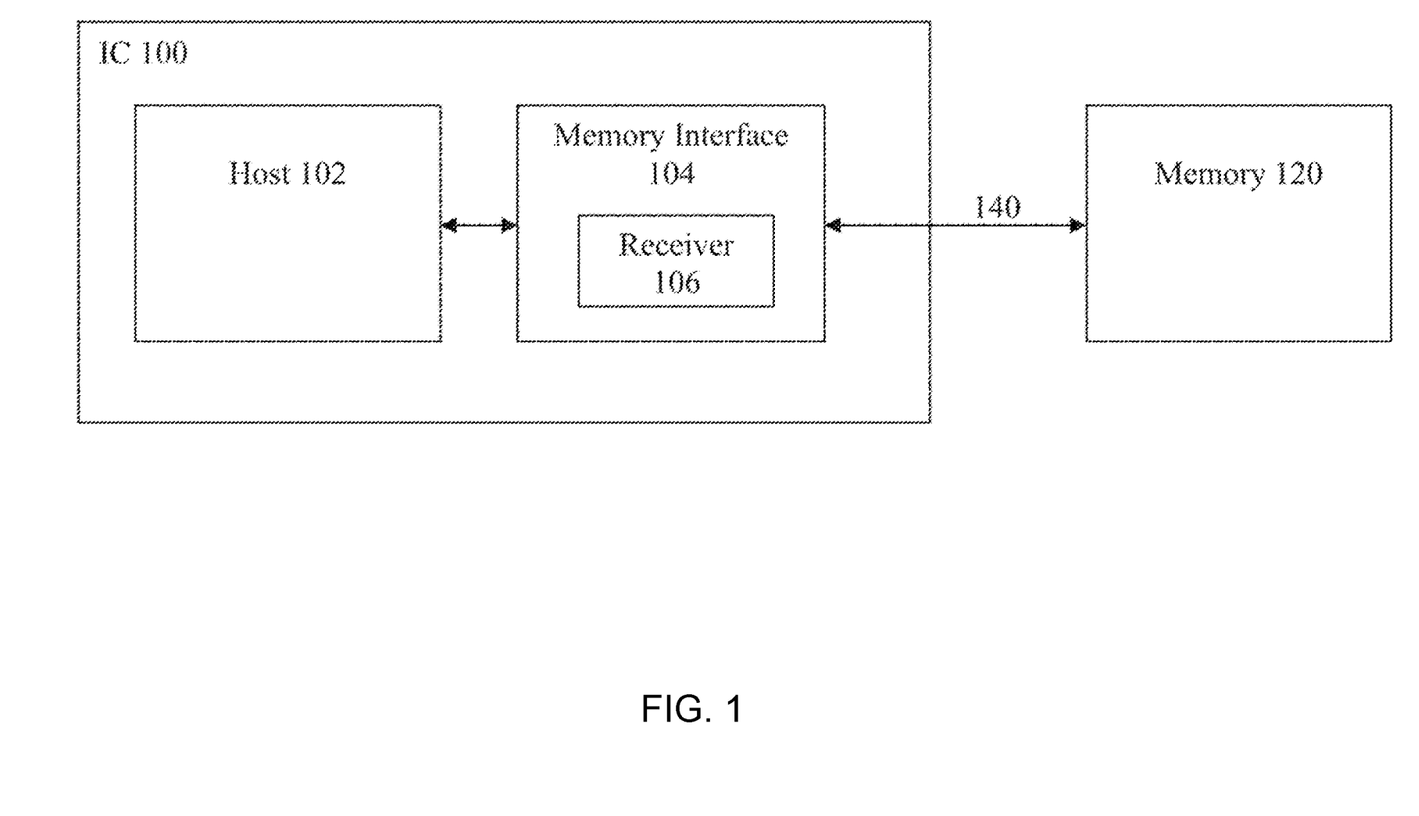
FIG. 1 is a block diagram of an example system in which the present embodiments may find useful application.
Figure 2:
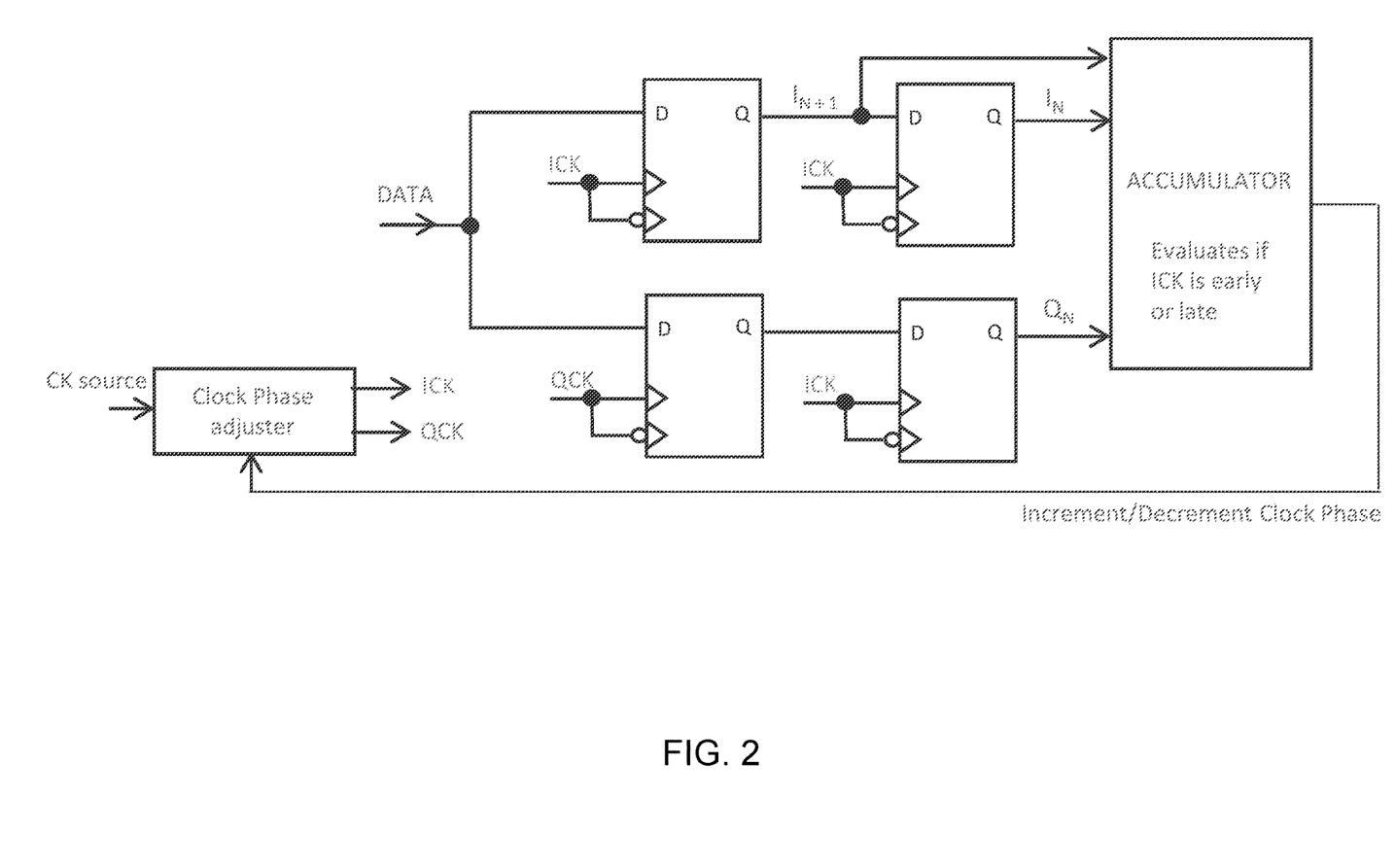
FIG. 2 shows a diagram illustrating an example clock phase recovery loop consistent with an embodiment of the present disclosure.

FIG. 1 illustrates an example interface between an integrated circuit (IC) 100 and a memory module 120, in accordance with some embodiments described herein. The memory module 120 may be a dynamic random access memory (DRAM) that may be connected to the integrated circuit by a bus 140, which may include an address bus, a data bus, read-write (R/W) signals, and a chip-enable (CE) signal. IC 100 may be an application specific integrated circuit (ASIC) or a system on a chip (SoC). Host 102 may be a microprocessor such as a CPU, DSP or processor core. Memory module 120 may be controlled on a system clock and can therefore be referred to as SDRAM. Embodiments of IC 100 may include additional components than shown in FIG. 1, however illustration thereof is omitted herein for sake of clarity.

Single data rate (SDR) SDRAM was originally built to execute one memory read access or one write access per clock cycle. On each clock cycle, an n-bit word may be transferred to or from the memory. The word length is, in some embodiments, configured in multiples of eight, and in more recent computer machines, it is common to transfer 64-bit words per clock cycle. DDR SDRAM was implemented as an improvement over SDR SDRAM and is capable of performing two read accesses or two write accesses per clock cycle. This was accomplished by performing one access on the rising edge of the clock and one access on the falling edge of the clock. In this manner, the data transfer rate may be doubled by transferring two 64-bit words per clock cycle. The standard protocols for operating DDR SDRAM are defined by JEDEC, with the most recent standards including DDR4, DDR5, GDDR6, etc.

In some embodiments, the operation of host 102 may involve the execution of programs that are loaded into the memory module 120 so as to create, edit, and delete data that may also be stored in the memory module 120 or other devices. Specifically, each microprocessor operation involves a fetch and execute cycle where an instruction is read from the memory module 120, decoded by the host 102, and executed. Also, the execution of the instruction often involves a data read or a data write to the memory module 120. Each of these instruction cycles may be performed synchronously to a system clock, with the duration of the instruction cycle lasting between one and three clock cycles.

More particularly, during a read operation, the host 102 may indicate the address location from which data from the memory module 120 is to be read. Memory interface 104 may be responsible for indicating the address on the address bus, floating the data bus (e.g., high Z or high impedance state), and asserting the CE and R/W signals for a read operation. Then the memory module 120 may place the data from the memory location indicated by the address bus onto the data bus. The memory interface 104 may then read the data from the data bus. More particularly, receiver 106 may convert the data signals from the memory module 120 to the voltage levels needed by host 102, and the read operation is complete. In this regard, memory types such as DDR4 typically operate between a VDDQ=1.32 Volt supply voltage down to a VDDQ=1.08 Volt supply voltage, while current microprocessor cores operate with a power supply voltage as low as VDD-0.65 Volts. The microprocessor supply voltage, core supply voltage, or signal supply voltage will be referred to herein as VDD while the memory supply voltage or I/O supply voltage will be referred to as VDDQ.

Referring now to FIGS. 2-12, embodiments consistent with the teachings of the present disclosure are provided. Embodiments included herein may be used to speed up the settling time of accumulators used in training algorithms for high-speed systems, thereby reducing the training algorithm convergence time. Typically, in a training algorithm used in high-speed data transfer systems, a decision may be made based on an evaluation. For example, a decision to increase or decrease the phase of a sampling clock may be based on the sampled data value.

In some embodiments, in order to minimize the impact of supply noise, signal jitter, and other non-idealities on the decision being made, the same evaluation may be repeated multiple times. The result of each evaluation may be accumulated over time and the decision is made only when the accumulated result reaches a defined threshold. A high accumulator threshold ensures good noise filtering (good accuracy) but slows down the decision-making process (increases convergence time). A low accumulator threshold helps in providing faster convergence of the algorithm, but compromises accuracy.

Embodiments included herein provide for faster convergence of accumulation-based algorithms without compromising the accuracy by dynamically changing the accumulator threshold. The teachings of the present disclosure may be used in high-speed data transfer systems like DDR, USB, and HDMI where training algorithms using accumulators are employed. Using embodiments of the present disclosure, these training algorithms are expected to converge faster thereby reducing the training time.

Referring again to FIG. 2, a diagram illustrating an example clock phase recovery loop consistent with an embodiment of the present disclosure is provided. This particular embodiment depicts an accumulator used in the clock phase recovery loop. The purpose of a clock phase recovery loop is to place the sampling clock at the center of the data eye width.

Figure 3:
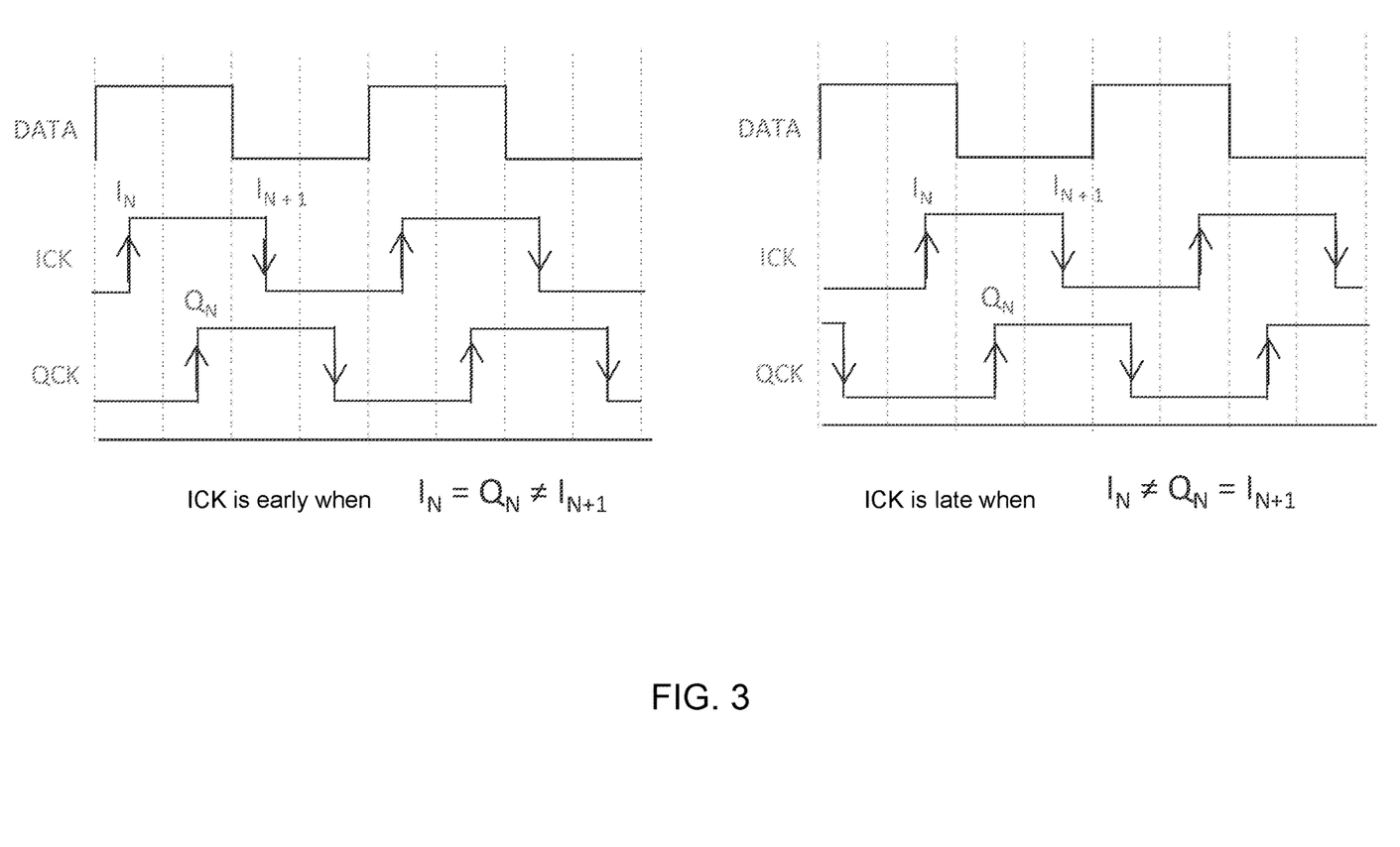
FIG. 3 shows an example of early and late in-phase clock logic consistent with an embodiment of the present disclosure.

In operation, data may be sampled using an in-phase clock (ICK) and a quadrate-phase clock (QCK). In some embodiments, ICK and QCK may be 90° apart in phase. Data sampled by the ICK and QCK are referred to herein as "$I_N$" and "$Q_N$" samples respectively. "$I_N$", "$Q_N$" and "$I_{N+1}$" samples may be analyzed to determine whether the clock is early or late when compared to the ideal sampling point as shown in FIG. 3.

In some embodiments, based on the analysis outcome, a decision to increment or decrement the clock phase is taken. The decision to update the clock phase is not based on one sample outcome. In contrast, multiple "$I_N$", "$Q_N$", and "$I_{N+1}$" samples may be taken over time and the result may be accumulated. The decision to increment or decrement the clock phase may be taken only when the accumulated result reaches a user-defined threshold.

In some embodiments, an example of accumulator logic may be defined as follows:
If {early count−late count>threshold} then increase the clock phase (this operation delays ICK, as the clock is earlier than expected)
If {late count−early count>threshold} then decrease the clock phase (this operation advances ICK, as the clock is later than expected)

Once a decision to advance or delay the clock is taken, early and late counts are reset to zero and the evaluation starts for the new ICK phase.

As discussed above, embodiments of the present disclosure introduce the concept of a dynamic accumulator threshold. The clock phase recovery loop converges when the number of "early" outcomes is equal to "late" outcomes. That's the condition at which the ICK phase is not updated, and the loop is considered as converged.

Figure 4:
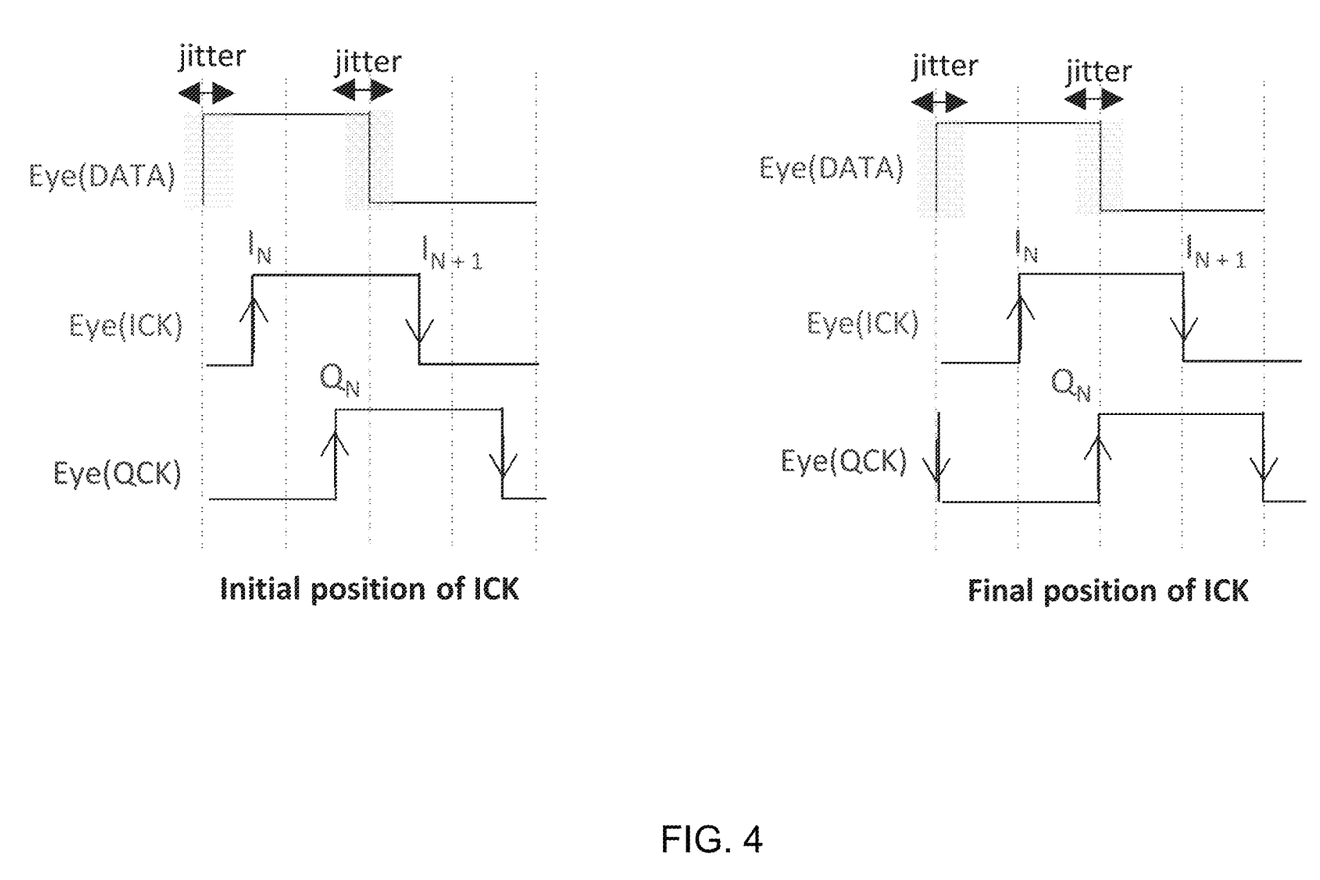
FIG. 4 shows an example of the initial position and the final position of the in-phase clock logic consistent with an embodiment of the present disclosure.

Referring now to FIG. 4, an example showing the initial position and the final position of the in-phase clock logic consistent with an embodiment of the present disclosure is provided.

Consider the initial ICK position in FIG. 4. At this position, $I_N$, $Q_N$ and $I_{N+1}$ are all out of the jitter zone and the $I_N=Q_N \neq I_{N+1}$ condition will be satisfied for all samples accumulated over time. All evaluations indicate ICK is early (early density=100%, late density=0%). Accordingly, all of the evaluation outcomes will be "early". In other words, "early density" will be 100%, and "late density" will be 0%, where early density depends on the ratio of the number of "early" outcomes to the sum of "early" and "late" outcomes. Similarly, "late density" depends on the ratio of the number of "late" outcomes to the sum of "early" and "late" outcomes.

Figure 5:
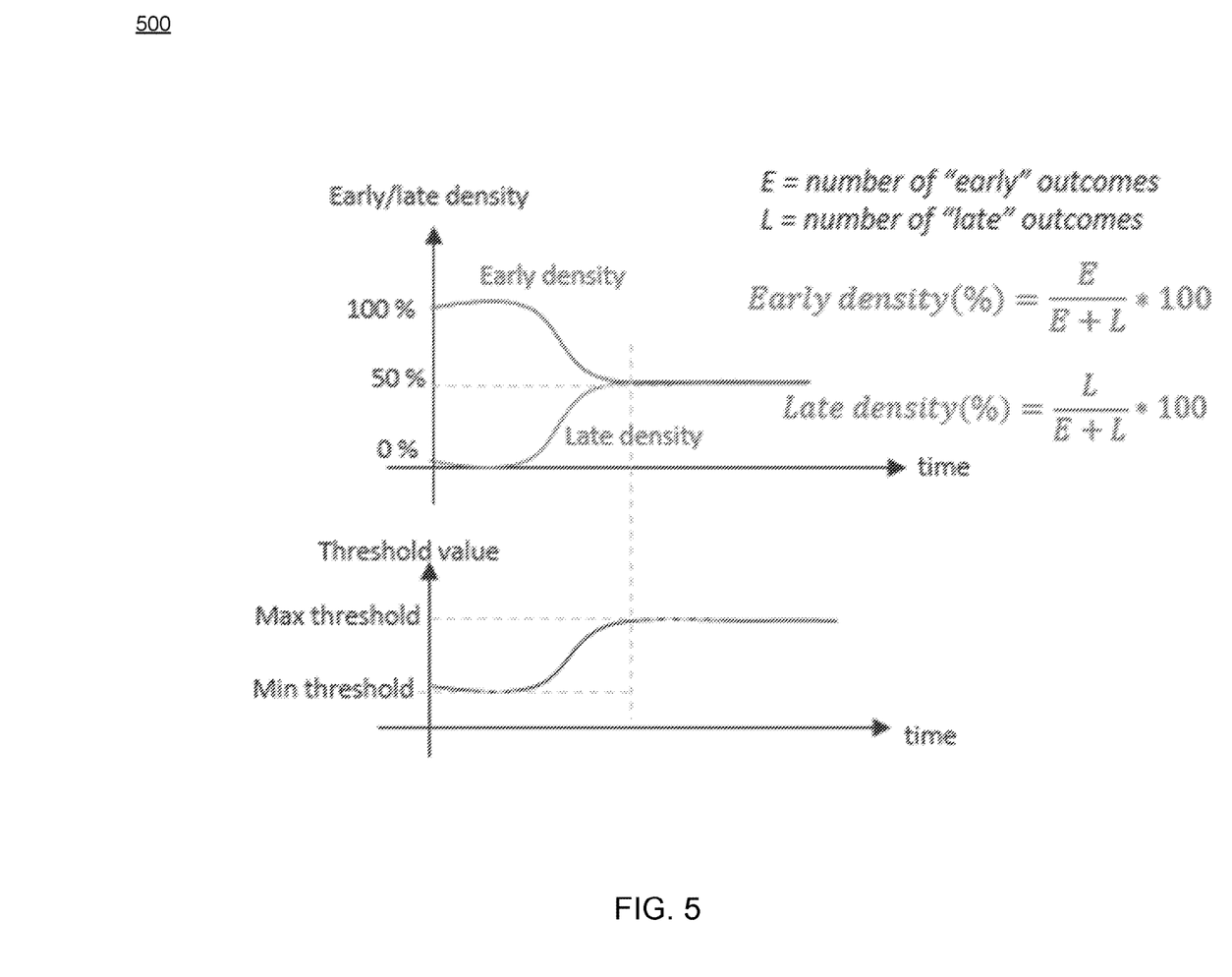
FIG. 5 shows an example graph depicting dynamic threshold adjustment consistent with an embodiment of the present disclosure.

In contrast, consider the final ICK position in FIG. 4. 50% of evaluations indicate ICK is early (early density=50%, late density=50%). At this position, 50% of the evaluation will result in an "early" outcome and 50% of the evaluation will result in a "late" outcome. Accordingly, this is the final convergence point. A low value of either "early density" or "late density" indicates that the convergence point is distant and, as such, the thresholds may be lowered. When either early or late density gets close to 50%, it indicates that the convergence point is close (QCK position is in the jitter zone), where the threshold needs to be high for better noise filtering. Accordingly, based on early and late density values, the accumulator threshold may be dynamically adjusted to speed up the convergence as shown in FIG. 5, which shows an example graph depicting dynamic threshold adjustment consistent with an embodiment of the present disclosure.

Figure 6:
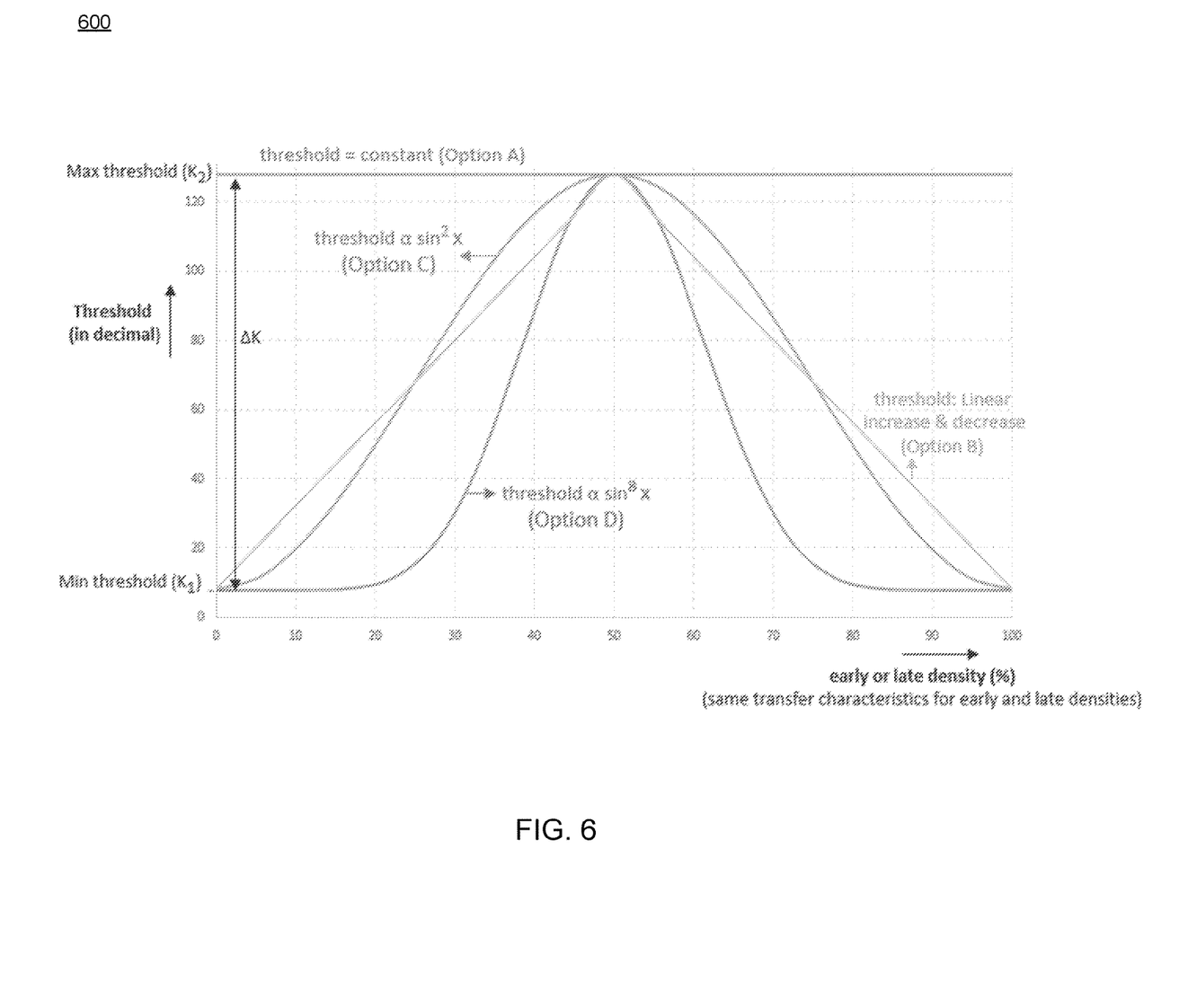
FIG. 6 shows an example graph showing threshold vs. early/late density consistent with an embodiment of the present disclosure.
Figure 7:
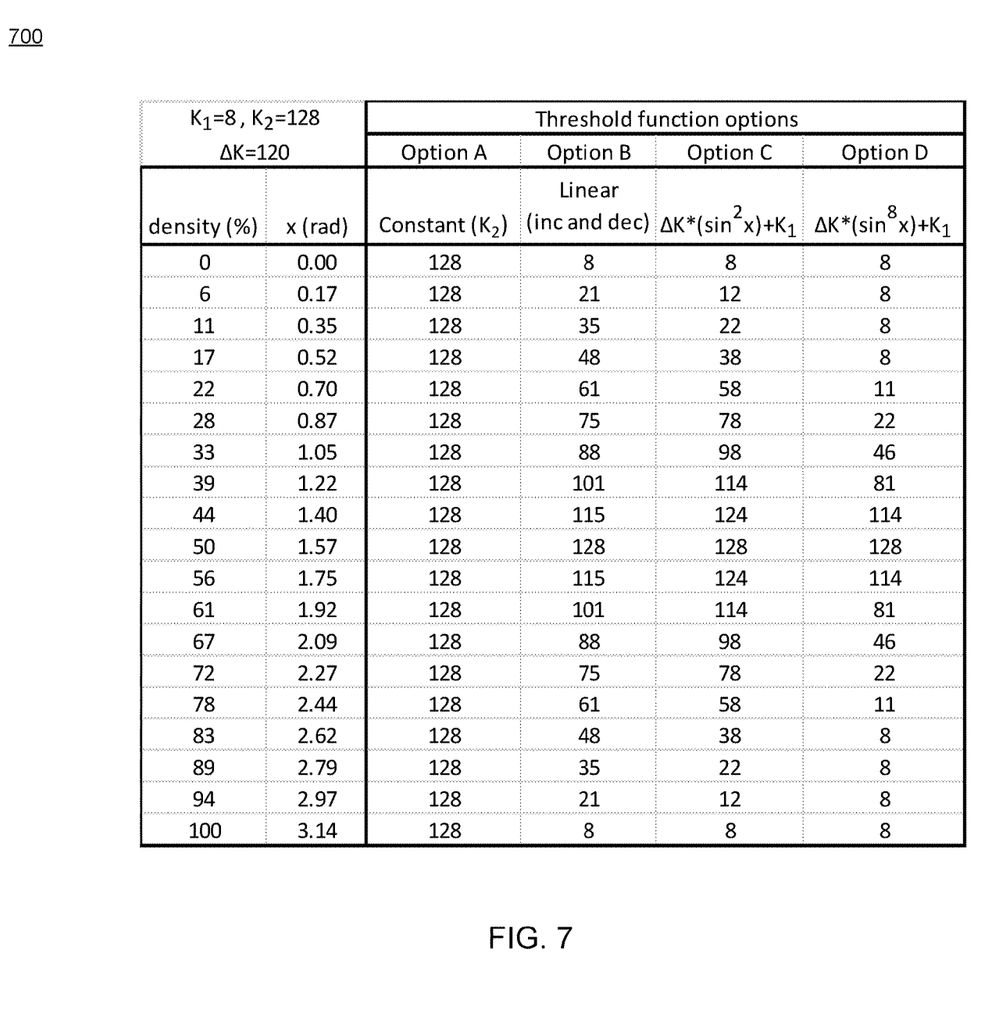
FIG. 7 shows an example table showing threshold vs. early/late density consistent with an embodiment of the present disclosure.

Referring now to FIG. 6, an example graph showing threshold vs. early/late density consistent with an embodiment of the present disclosure is provided. More particularly, FIG. 6 shows four options for accumulator threshold function (in this example data from FIG. 7 is plotted in FIG. 6). Option A: Used in existing accumulators. The threshold is maintained constant until convergence is achieved. Option B: Maximum threshold is used when the early/late density is 50%. The threshold starts to drop linearly on either side of 50% density point. The convergence time is expected to be faster than Option A. Option C: Threshold proportional to $\sin^2 x$ function ("x" in radians). This may be preferable over Option B as the threshold is higher between 25%-75% density when compared to Option B. The convergence time is expected to be the same as Option B as between (0-25%) and (75%-100%) density range, the threshold is lower than Option B. Option D: Threshold proportional to $\sin^8 x$ function ("x" in radians"). This option may be expected to have the fastest convergence time, as the threshold is either less than or equal to the threshold in Options C and B across all density points. Among the four options, Option D may be preferable as the convergence time is the least without compromising on accuracy. If a conservative option is preferred by the user, Option C may be preferable.

Figure 8:
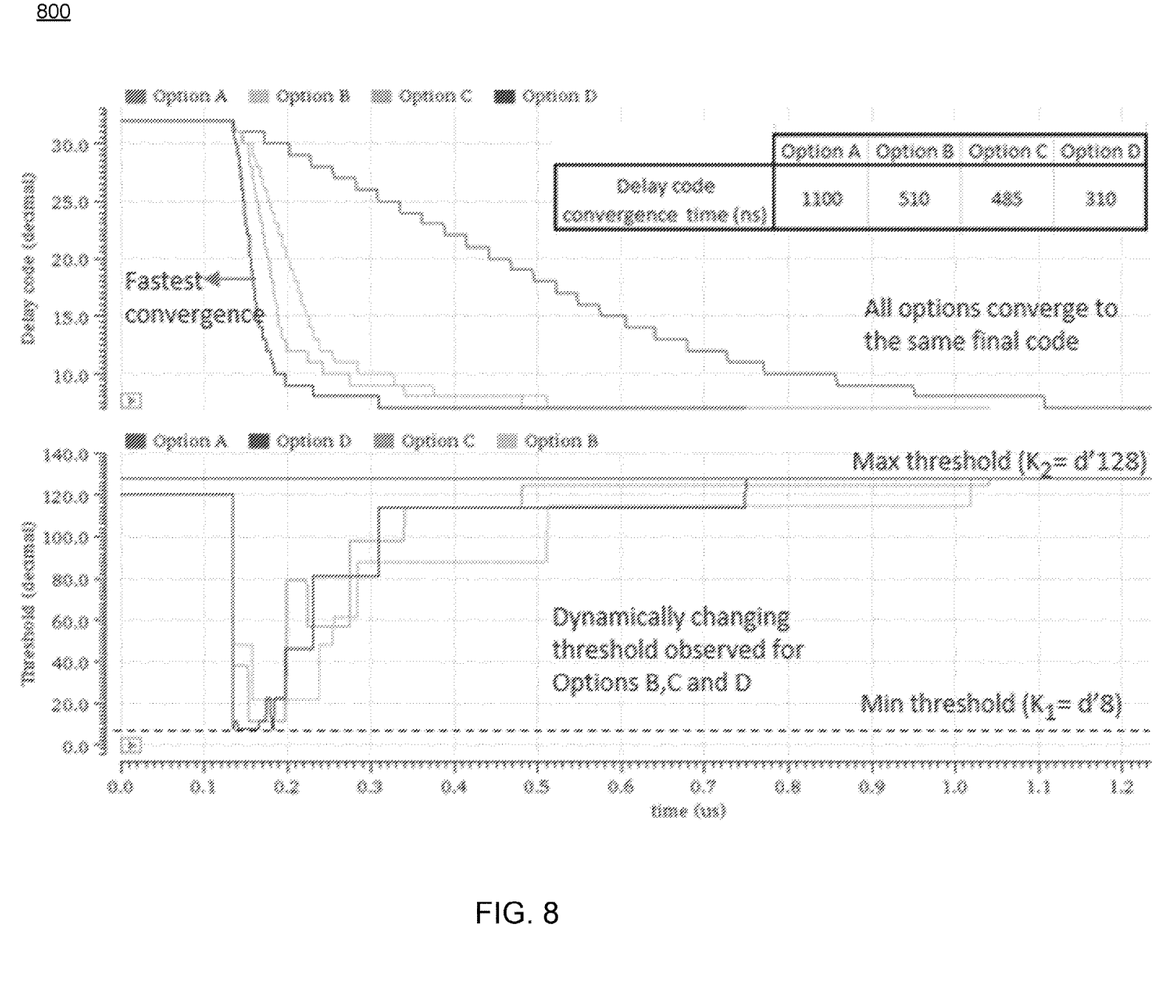
FIG. 8 shows an example plot showing convergence time and threshold variation over time consistent with an embodiment of the present disclosure.
Figure 9:
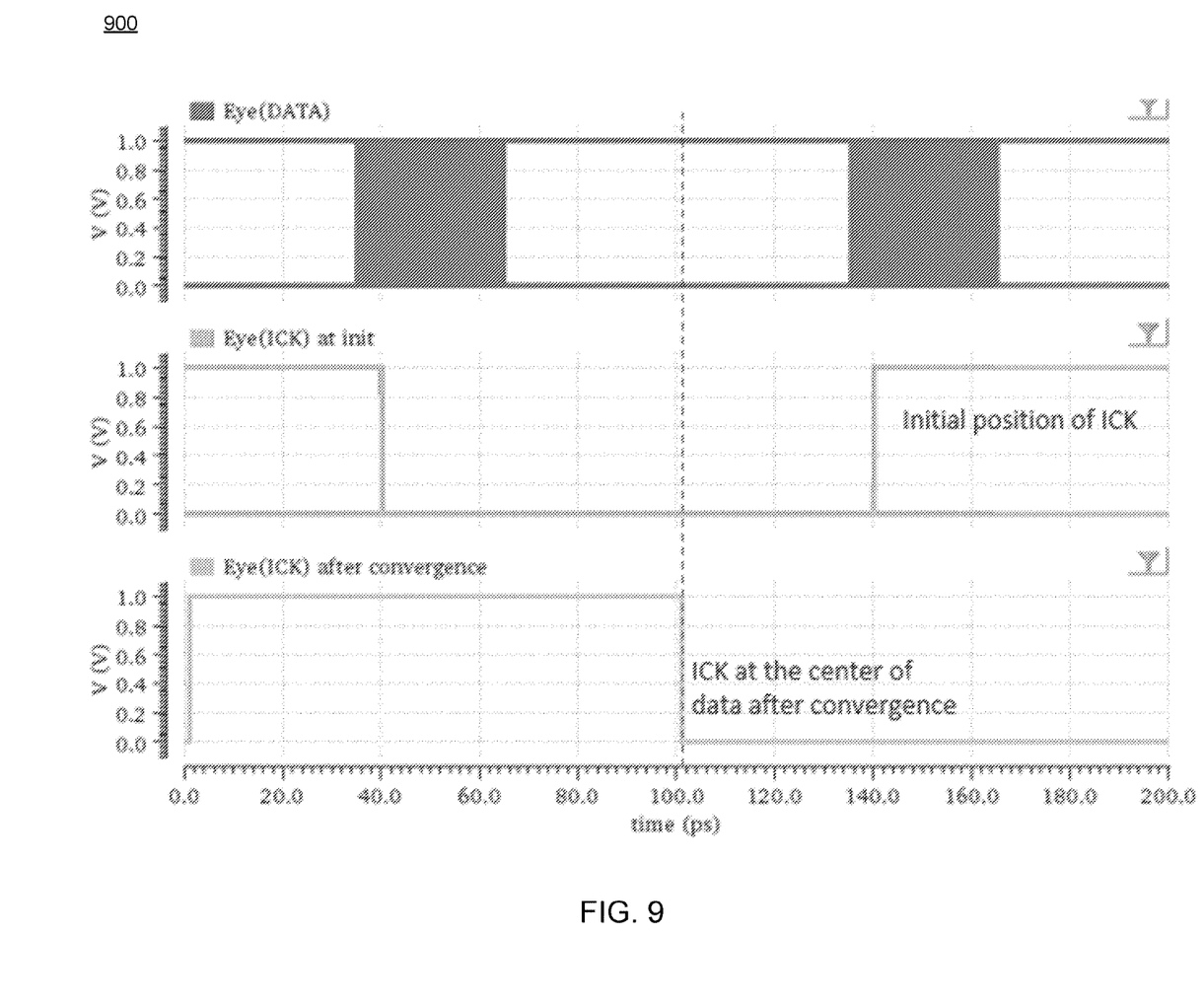
FIG. 9 shows an example plot showing in phase clock position before and after training consistent with an embodiment of the present disclosure.

FIG. 8 shows an example plot showing convergence time and threshold variation over time consistent with an embodiment of the present disclosure. In this particular example, a Verilog-A model for a fast settling accumulator was built for the clock phase recovery system shown in FIG. 2 and simulations were run. Simulation results for all 4 accumulator threshold function options are shown in FIG. 8. This particular example utilized the following parameters for simulation: Data rate of 10 Gbps, ICK & QCK of 5 GHz frequency, Jitter (pp) of 30 ps, minimum and maximum accumulator thresholds of d'8 and d'128 respectively. ICK phase is adjusted by changing the "delay code". All options converge to the same delay code. At the converged code, ICK is at the center of data eye-opening as shown in FIG. 9, which shows an example plot showing in phase clock position before and after training consistent with an embodiment of the present disclosure. As expected, Option D shows the fastest convergence, and Option A shows the slowest convergence. Options B and C exhibit almost similar convergence times as shown in FIG. 8.

Figure 10:
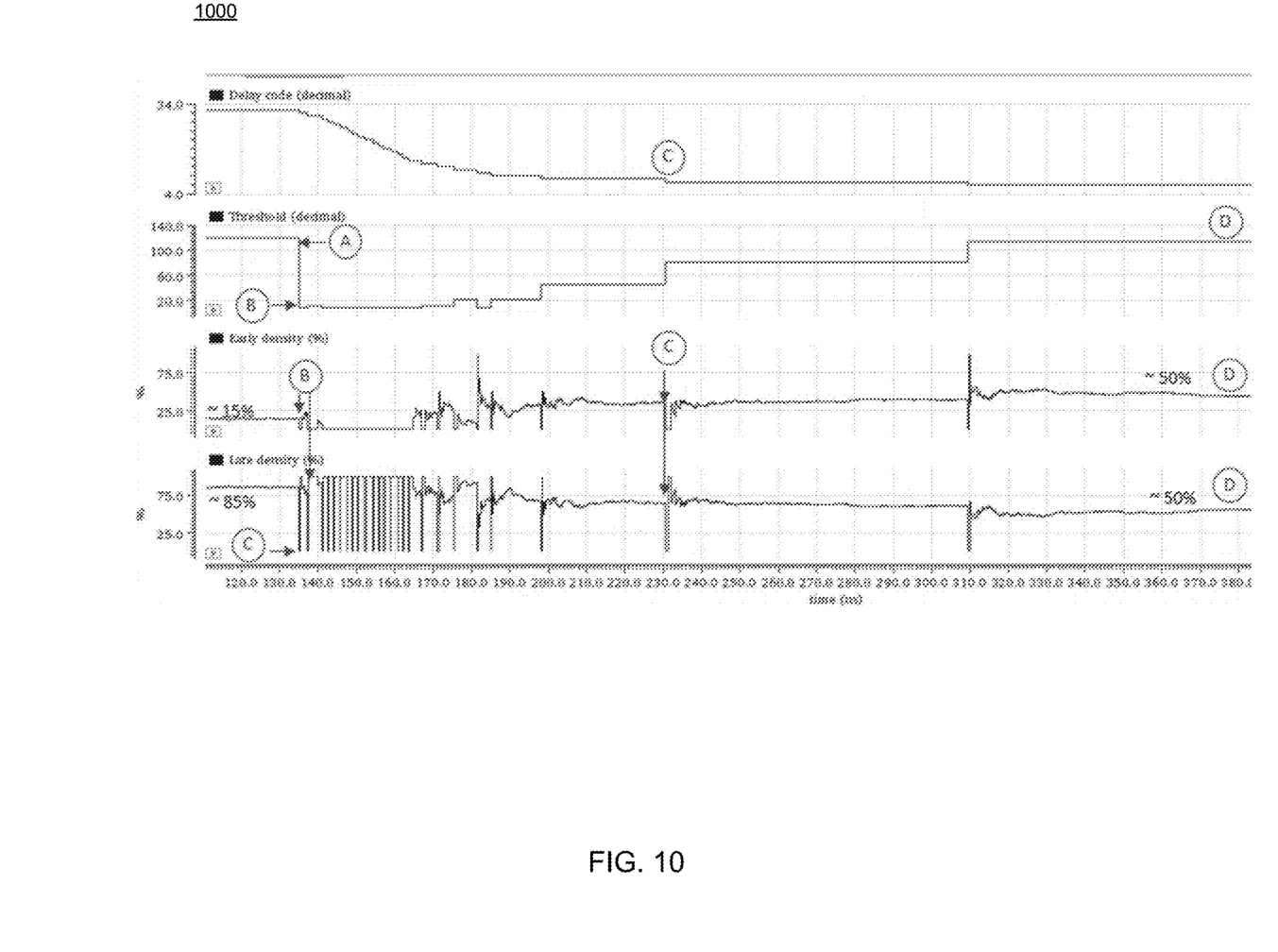
FIG. 10 shows an example plot showing early and late density consistent with an embodiment of the present disclosure.

FIG. 10 shows an example plot showing early and late density consistent with an embodiment of the present disclosure. More specifically, FIG. 10 shows a plot depicting the relationship between threshold and early/late density for Option D, where circled A indicates max threshold used for the 1st iteration, circled B indicates threshold based on early & late density, circled C indicates early & late density values are reset to 0% after the delay code is updated (this is to do a fresh evaluation for the new delay code), and circled D indicates at convergence, early & late density is ~50% and the threshold is close to the maximum value. For the first iteration, the maximum threshold is used. It is not mandatory to use the maximum threshold for the first iteration, as early and late density evaluation may be performed (pre-evaluation) before the training starts. The outcome of this pre-evaluation may be used to determine the threshold for the first iteration. Alternatively, the user may select the maximum threshold for the first iteration (as in FIG. 10) without performing pre-evaluation and from the second iteration onwards, the threshold may be made dependent on early/late density. The threshold is the lowest when the early or late density is either too high or too low. The threshold is at its maximum when the early or late density is 50%. When the delay code converges towards the final value, the threshold is maximum. This avoids ringing or oscillations around the final convergence point. Once the decision to either increase or decrease the delay code is made, both early and late density values are reset to 0%, so that a fresh evaluation of early/late densities is started for the new delay code.

Figure 11:
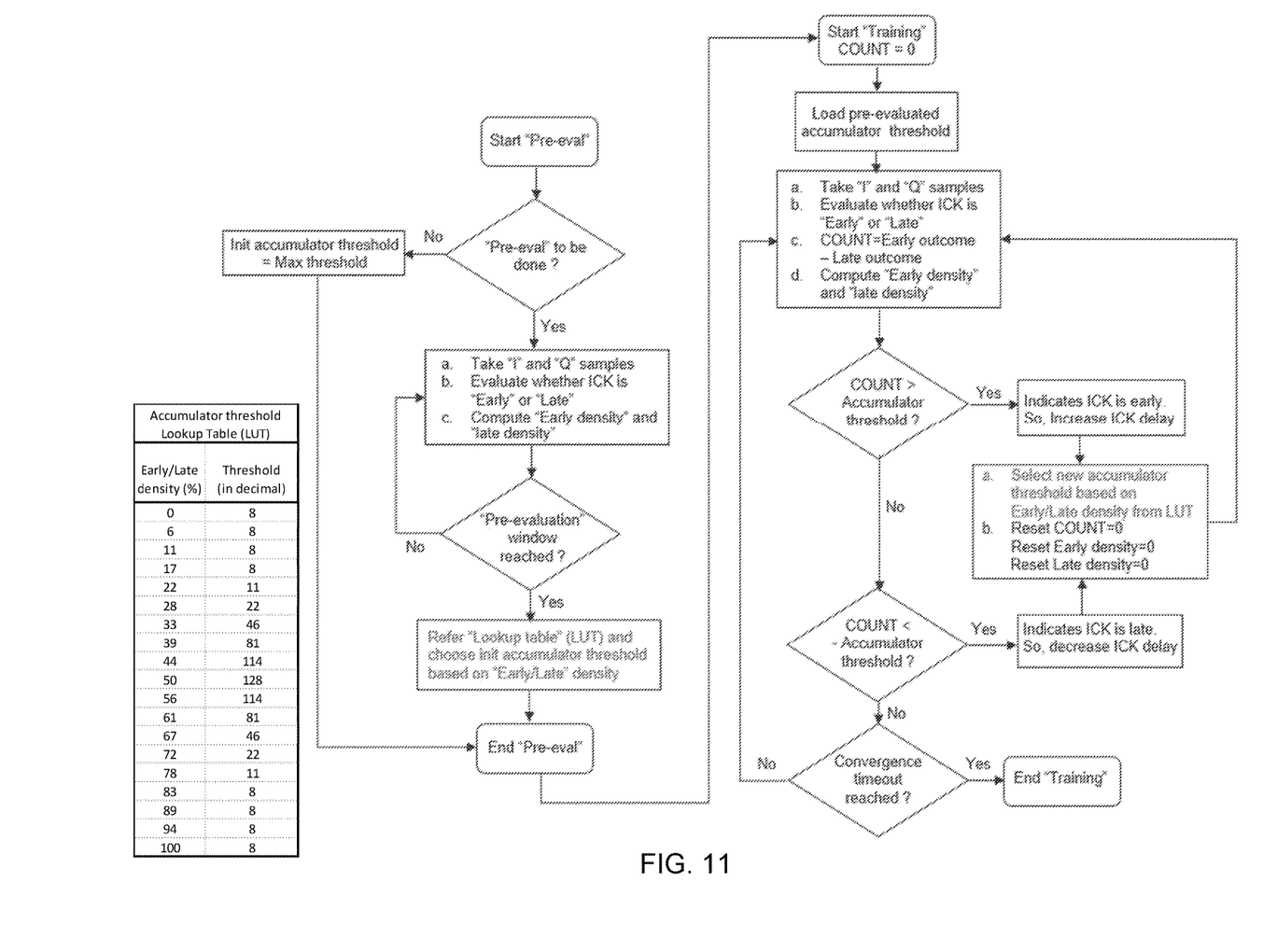
FIGS. 11-12 include flowcharts depicting operations consistent with an embodiment of the present disclosure.

Referring now to FIG. 11 a flowchart depicting operations consistent with an embodiment of the present disclosure is provided. FIG. 11 also includes an example of an accumulator threshold look-up-table (LUT) [threshold α $\sin^8$ x (i.e., Option D)]. It should be noted that each of the operations shown in FIG. 11 may be performed by host 102 and there is no manual intervention required. In operation, the process may begin with determining whether pre-evaluation is to be performed 1102. If not, then the initial accumulator threshold may equal the maximum threshold and pre-evaluation may be concluded 1104. If pre-evaluation is to be performed the process may take the "I" and "Q" samples and evaluate whether ICK is early or late. The process may then compute 1106 the early density and the late density. The process may then determine 1108 whether or not the "pre-evaluation" window has been reached. If yes, then the process may refer 1110 to the look-up-table (LUT), shown in FIG. 11, and select the initial accumulator threshold based upon the early/late density information. This may end 1112 the pre-evaluation. At this point, the training stage may begin 1114 with COUNT=0. The process may then load 1116 the pre-evaluated accumulator threshold. The process may take the "I" and "Q" samples and evaluate 1118 whether ICK is early or late. The process may then determine a COUNT by subtracting late outcomes from early outcomes and may then compute early density and late density. The process may then determine 1120 whether the COUNT is greater than the accumulator threshold. If the COUNT is less than the accumulator threshold a determination 1124 may be made whether convergence timeout has been reached. If not, the process returns to operation 1118. Training may end if convergence timeout has been reached. Alternatively, if the COUNT is greater than the accumulator threshold this indicates that ICK is early, the process may then increase 1126 ICK delay. The process may then select 1128 a new accumulator threshold based on early/late density from the LUT. The process may reset the COUNT=0, reset early density=0, and reset late density=0. If the COUNT is less than the accumulator threshold this may indicate that ICK may be late and the process may decrease the ICK delay.

Figure 12:
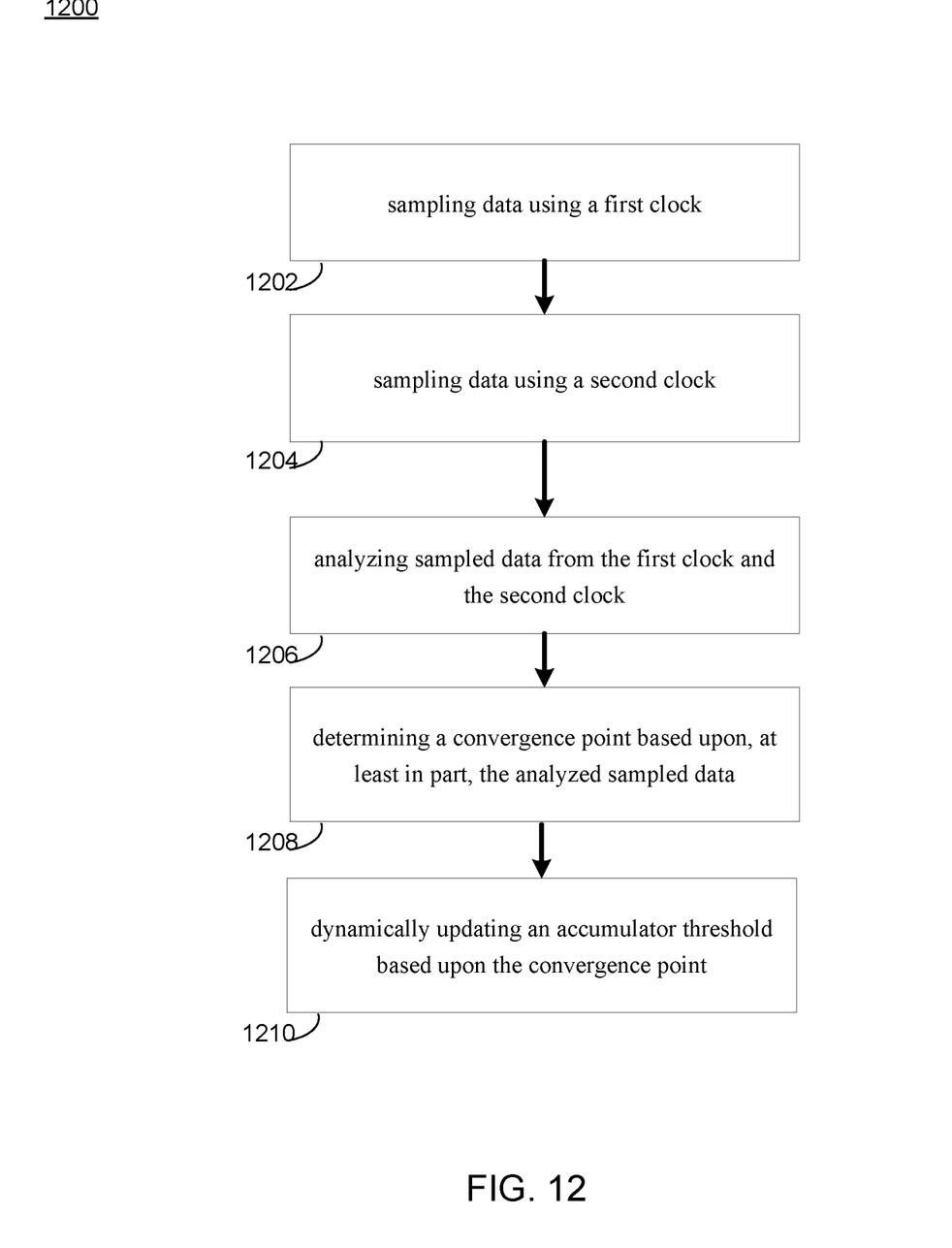

Referring now to FIG. 12 a flowchart depicting operations consistent with an embodiment of the present disclosure is provided. The method may include sampling 1202 data using a first clock and sampling 1204 data using a second clock. The method may further include analyzing 1206 sampled data from the first clock and the second clock and determining 1208 a convergence point based upon, at least in part, the analyzed sampled data. The method may also include dynamically updating 1210 an accumulator threshold based upon the convergence point. Numerous additional operations are also within the scope of the present disclosure.

Embodiments of the fast settling accumulator approach disclosed herein may be used with a variety of different applications. Accumulators are used in training algorithms for high-speed IPs. Some training algorithms where an accumulator may be used include, but are not limited to, clock phase training, reference voltage training for single-ended signaling, equalization training (e.g., decision feedback equalization (DFE), continuous time linear equalization (CTLE), feed forward equalization (FFE), clock duty cycle correction training, and transmitter impedance training (ZQ CAL), etc.

Although only four options for an accumulator threshold function are discussed herein, it should be noted that the concept of dynamically updating the accumulator threshold based on the location of the convergence point, may be extended to a variety of other applications. It may be essential to have a higher threshold value around the final convergence point, and a lower threshold value when the current iteration is away from the final convergence point for faster convergence without any loss of accuracy The terminology used herein is for the purpose of describing particular embodiments and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

Although a few example embodiments have been described in detail above, those skilled in the art will readily appreciate that many modifications are possible in the example embodiments without materially departing from the scope of the present disclosure, described herein. Accordingly, such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph (f) for any limitations of any of the claims herein, except for those in which the claim expressly uses the words 'means for' or 'step for' together with an associated function.

Having thus described the disclosure of the present application in detail and by reference to embodiments thereof, it will be apparent that modifications and variations are possible without departing from the scope of the disclosure defined in the appended claims.

What is claimed is:

1. A clock phase recovery method, comprising:
   sampling data using a first clock;
   sampling data using a second clock;
   analyzing sampled data from the first clock and the second clock;
   determining a convergence point based upon, at least in part, the analyzed sampled data; and
   dynamically updating an accumulator threshold based upon the convergence point, wherein the clock phase recovery method is included within a process selected from the group consisting of reference voltage training for single-ended signaling, equalization training, continuous time linear equalization (CTLE), feed forward equalization (FFE), clock duty cycle correction training, and transmitter impedance training, wherein dynamically updating is based upon, at least in part, a number of early sampled outcomes and a number of late sampled outcomes.

2. The clock phase recovery method of claim 1, wherein the first clock is an in-phase clock.

3. The clock phase recovery method of claim 1, wherein the second clock is a quadrate phase clock.

4. The clock phase recovery method of claim 1, wherein dynamically updating is based upon, at least in part, an analysis of early density and late density.

5. The clock phase recovery method of claim 1, wherein the first clock and the second clock are 90° apart in phase.

6. The clock phase recovery method of claim 1, further comprising:
   determining whether to increment or decrement the clock phase based upon, at least in part, the dynamically updated accumulator threshold.

7. The clock phase recovery method of claim 1, wherein the convergence point corresponds to a point where the number of early sampled outcomes equals the number of late sampled outcomes.

8. The clock phase recovery method of claim 1, wherein the clock phase recovery method is included within an accumulator training process.

9. The clock phase recovery method of claim 8, wherein the accumulator training process is included within a high speed data transfer system selected from a group consisting of: double data rate (DDR), universal serial bus (USB), and high definition multimedia interface (HDMI).

10. A fast settling accumulator system, comprising:
    an in-phase clock configured to sample data;
    a quadrate phase clock configured to sample data; and
    a processor configured to analyze sampled data from the in-phase clock and the quadrate phase clock, determine a convergence point based upon, at least in part, the analyzed sampled data and to dynamically update an accumulator threshold based upon the convergence point, wherein the fast settling accumulator is included within a process selected from a group consisting of reference voltage training for single-ended signaling, equalization training, continuous time linear equalization (CTLE), feed forward equalization (FFE), clock duty cycle correction training, and transmitter impedance training, wherein dynamically updating is based upon, at least in part, a number of early sampled outcomes and a number of late sampled outcomes.

11. The fast settling accumulator system of claim 10, wherein dynamically updating is based upon, at least in part, an analysis of early density and late density.

12. The fast settling accumulator system of claim 10, wherein the first clock and the second clock are 90° apart in phase.

13. The fast settling accumulator system of claim 10, further comprising:
    determining whether to increment or decrement the clock phase based upon, at least in part, the dynamically updated accumulator threshold.

14. The fast settling accumulator system of claim 10, wherein the convergence point corresponds to a point where the number of early sampled outcomes equals the number of late sampled outcomes.

15. The fast settling accumulator system of claim 10, wherein the clock phase recovery method is included within an accumulator training process.

16. The fast settling accumulator system of claim 15, wherein the accumulator training process is included within a high speed data transfer system selected from a group consisting of: double data rate (DDR), universal serial bus (USB), and high definition multimedia interface (HDMI).

17. A fast settling accumulator method, comprising:
    sampling data using an in-phase clock;
    sampling data using a quadrate phase clock;
    analyzing sampled data from the in-phase clock and the quadrate phase clock;
    determining a convergence point based upon, at least in part, the analyzed sampled data, wherein the convergence point corresponds to a point where a number of early sampled outcomes is approximately equal to a number of late sampled outcomes; and
    dynamically updating an accumulator threshold based upon the convergence point, wherein the fast settling accumulator is included within a process selected from a group consisting of reference voltage training for single-ended signaling, equalization training, continuous time linear equalization (CTLE), feed forward equalization (FFE), clock duty cycle correction training, and transmitter impedance training, wherein dynamically updating is based upon, at least in part, the number of early sampled outcomes and the number of late sampled outcomes.

* * * * *